(12) United States Patent
Haller et al.

(10) Patent No.: US 7,808,053 B2
(45) Date of Patent: Oct. 5, 2010

(54) METHOD, APPARATUS, AND SYSTEM FOR FLASH MEMORY

(75) Inventors: Gordon Haller, Boise, ID (US); Luan C. Tran, Meridian, ID (US)

(73) Assignee: Intel Corporation, Santa Clara, CA (US)

( * ) Notice: Subject to any disclaimer, the term of this patent is extended or adjusted under 35 U.S.C. 154(b) by 440 days.

(21) Appl. No.: 11/618,658

(22) Filed: Dec. 29, 2006

(65) Prior Publication Data

US 2008/0162781 A1 Jul. 3, 2008

(51) Int. Cl.
*H01L 27/088* (2006.01)
(52) U.S. Cl. .............................. 257/390; 257/E27.103
(58) Field of Classification Search .................. 257/390
See application file for complete search history.

(56) References Cited

U.S. PATENT DOCUMENTS

| | | | |
|---|---|---|---|
| 6,833,575 B2 * | 12/2004 | Parekh et al. ............... | 257/296 |
| 7,115,525 B2 | 10/2006 | Abatchev et al. | |
| 7,151,040 B2 | 12/2006 | Tran et al. | |
| 7,411,255 B2 * | 8/2008 | Parekh et al. ............... | 257/390 |
| 2006/0046424 A1 | 3/2006 | Chance et al. | |
| 2006/0138563 A1 * | 6/2006 | Park et al. .................. | 257/390 |
| 2006/0262511 A1 | 11/2006 | Abatchev et al. | |
| 2006/0264001 A1 | 11/2006 | Tran et al. | |
| 2007/0239920 A1 * | 10/2007 | Frid ........................... | 710/306 |

\* cited by examiner

*Primary Examiner*—Phat X Cao
(74) *Attorney, Agent, or Firm*—Schwegman, Lundberg & Woessner, P.A.

(57) ABSTRACT

Embodiments of the present invention provide apparatus, methods and systems that include a substrate including a central region and a peripheral region; a plurality of layers above a surface of the substrate, a first plurality of pitch-multiplied spacers on a top surface of the plurality of layer, the first plurality of pitch-multiplied spacers being above the central region of the substrate, and a second plurality of pitch-multiplied spacers on the top surface of the plurality of layers, the second plurality of pitch-multiplied spacers above the peripheral region and including at least one pitch-multiplied spacer having a surface at a distance from the at least one pitch multiplied spacer having a surface at the boundary.

10 Claims, 5 Drawing Sheets

METHOD, APPARATUS, AND SYSTEM FOR FLASH MEMORY

This application is the result of a joint research agreement between Intel Corporation, a Delaware corporation ("Intel"), Micron Technology, Inc., a Delaware corporation ("Micron") and IM Flash Technologies, LLC, a Delaware limited liability company (the "Joint Venture Company")

FIELD

Embodiments of the present invention relate to integrated circuits, and more particularly, to integrated circuits including flash memory.

BACKGROUND

Memory devices can be categorized in two broad areas: volatile and non-volatile. Volatile memory devices require power to maintain data, while non-volatile memories are capable of maintaining data in the absence of a power supply. An example of a non-volatile memory is the flash memory that stores information in a semiconductor device without the need for power to maintain the information in the chip.

Flash memory can be built using either NOR or NAND devices. NAND flash can be either of single-level cell (SLC) or multi-level cell (MLC) configuration. MLC NAND flash allows for a higher density memory device in comparison to SLC NAND flash because it allows the storage of two or more data bits in each memory cell.

A trend in the design of memory devices, including flash memory, is to decrease the size of the memory device. One way of achieving this reduction in size is to reduce the size of the features that comprise the memory device. The reduction in the size of features induces a reduction in the size of devices included in the memory device, including the interconnective lines or traces used to electrically couple the circuit within the memory device. The reduction in the size of features also may include a reduction in the size of spaces between one or more features in the memory device, including but not limited to a reduction in one or more spaces between interconnective lines in the memory device. As a result, the techniques used to form the memory devices must increasingly be capable of producing smaller and more closely spaced components that comprise these memory devices.

DESCRIPTION OF EMBODIMENTS

Figure 1:
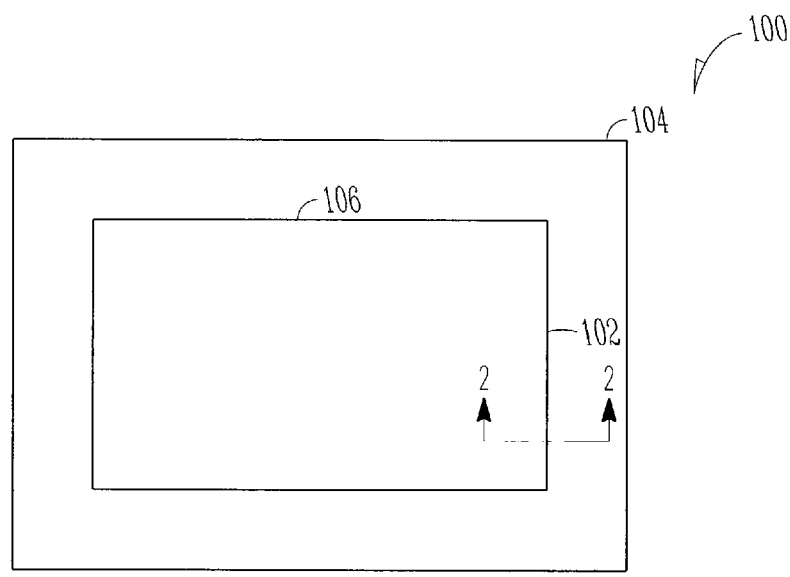
FIG. 1 illustrates a top view of a partially fabricated integrated circuit according to various embodiments of the invention.

By combining processes such as photolithography and pitch multiplication techniques, patterns that allow a reduction in the size of integrated circuits may be provided. These integrated circuits may include memory arrays and memory devices, such as but not limited to NAND flash memory.

In the fabrication of integrated circuits that may include NAND flash memory, photolithography may be used to pattern features, such as conductive lines, on a substrate. The term "pitch" may be used to describe the size of these features. Pitch may be defined as the distance between an identical point in two neighboring features. These features are typically defined by spacings between adjacent features, wherein the spacings may be filled by a material, such as an insulator. Features may include but are not limited to, conductive lines, and active devices, such as transistors, which may be coupled by one or more conductive lines. As a result, pitch can be viewed as the sum of the width of a feature and of the width of the space separating that feature from a neighboring feature. Due to factors such as optics and light or radiation wavelength, however, photolithography techniques each have a minimum pitch below which a particular photolithographic technique cannot reliably form features. Thus, the minimum pitch of a photolithographic technique can limit feature size reduction.

Using pitch multiplication, different sized features in a central region and in the periphery region of an integrated circuit. In various embodiments different sized features are patterned on a substrate in a single step. In particular, a mixed pattern, combining two separately formed patterns, is formed on a single mask layer and then transferred to the underlying substrate. In some embodiments, the first of the separately formed patterns is formed by pitch multiplication and the second of the separately formed patterns is formed by conventional photolithography. The first of the separately formed patterns includes lines that are below the resolution of the photolithographic process used to form the second of the separately formed patterns. These lines are made by forming a pattern on photoresistive layer and then etching that pattern into an amorphous carbon layer. Sidewall spacers having widths less than the widths of the un-etched parts of the amorphous carbon are formed on the sidewalls of the amorphous carbon. The amorphous carbon is then removed, leaving behind the sidewall spacers as a mask pattern.

Thus, the spacers form a pitch-multiplied mask having feature sizes less than the resolution of the photolithography process used to form the pattern on the photoresist. A protective material is deposited around the spacers. The spacers are further protected using a hard mask and then photoresistive layer is formed and patterned over the hard mask. The photoresistive pattern is transferred through the hard mask to the protective material. The pattern made out by the spacers and the temporary material is then transferred to an underlying amorphous carbon hard mask layer. The pattern, having features of difference sizes, is then transferred to the underlying substrate.

By using a combination of photolithography, pitch multiplication, and other processes used in the fabrication of integrated circuits as described herein, a memory device that requires a reduced space and still provides proper performance may be achieved. Various embodiments described herein provide for an apparatus, a method, and a system for fabricating a select gate line associated with a NAND flash memory device at a distance from the memory array and using pitch dimensions that provide reduced space memory devices while maintaining the performance characteristics of the memory device.

The accompanying drawings that form a part hereof show, by way of illustration and not of limitation, specific embodiments in which the subject matter may be practiced. The accompanying drawings are not necessarily drawn to scale.

FIG. 1 illustrates a top view of a partially fabricated integrated circuit 100. In various embodiments, integrated circuit 100 may be fabricated to form a memory chip, including but not limited to, a memory chip including NAND flash memory. In various embodiments, integrated circuit 100 includes a central region 102, the "array," which may be surrounded by a peripheral region 104, the "periphery." Boundary 106 may be a line designating the edges of the central region 102. Boundary 106 may be a buffer region where interconnection between the array and the periphery may be made. However, boundary 106 in not necessarily determined by a physical difference in the layers or in the materials included in central region 102 and peripheral region 104. Boundary 106 may be a line or a plurality of lines forming a shape which is arbitrarily determined to be the dividing line between the portion of the integrated circuit 100 designated as the central region 102 and the peripheral region 104. In various embodiments, the placement of boundary 106 is determined before fabrication of the integrated circuit 100 is begun, and is used to determine the placement of various devices, and the techniques to be used in the fabrication of these devices, in fabrication of the integrated circuit 100.

In various embodiments, after fabrication of the integrated circuit 100 is complete, the central region 102 will typically include a plurality of memory cells (not shown), the memory cells formed from such devices as transistors. The memory cells may be arranged in rows and columns to form the array. In addition, central region 102 may include a plurality of conductive lines (not shown). These conducive lines may be used to couple various devices in central region 102, and may include wordlines and bitlines coupled to the memory cells. In various embodiments, wordlines are included as part of one or more memory cells. In various embodiments, bitlines are coupled to the memory cells and to devices such as sense amplifiers (not shown). Central region 102 may include one or more conductive lines that couple the devices in the central region 102, including wordlines and bitlines, to one or more conductive lines formed in peripheral region 104. In various embodiments, pitch multiplication may be used to form features in the central region 102, as discussed below.

In various embodiments, the peripheral region 104 may include features having dimensions larger than those in the central region 102. In some embodiments, peripheral region 104 includes conductive lines or traces. These conductive lines or traces may include conductive lines or traces of various widths. In various embodiments, the widths of the conductive lines in peripheral region 104 are larger than one or more of the conductive lines in the central region 102. In some embodiments, more than one technique may be used to form the conductive lines in the peripheral region 104. In some embodiments, photolithography, pitch multiplication, or a combination of both photolithography and pitch multiplication may be used in forming the conductive lines in the peripheral region 104, as further described below.

Figure 2:
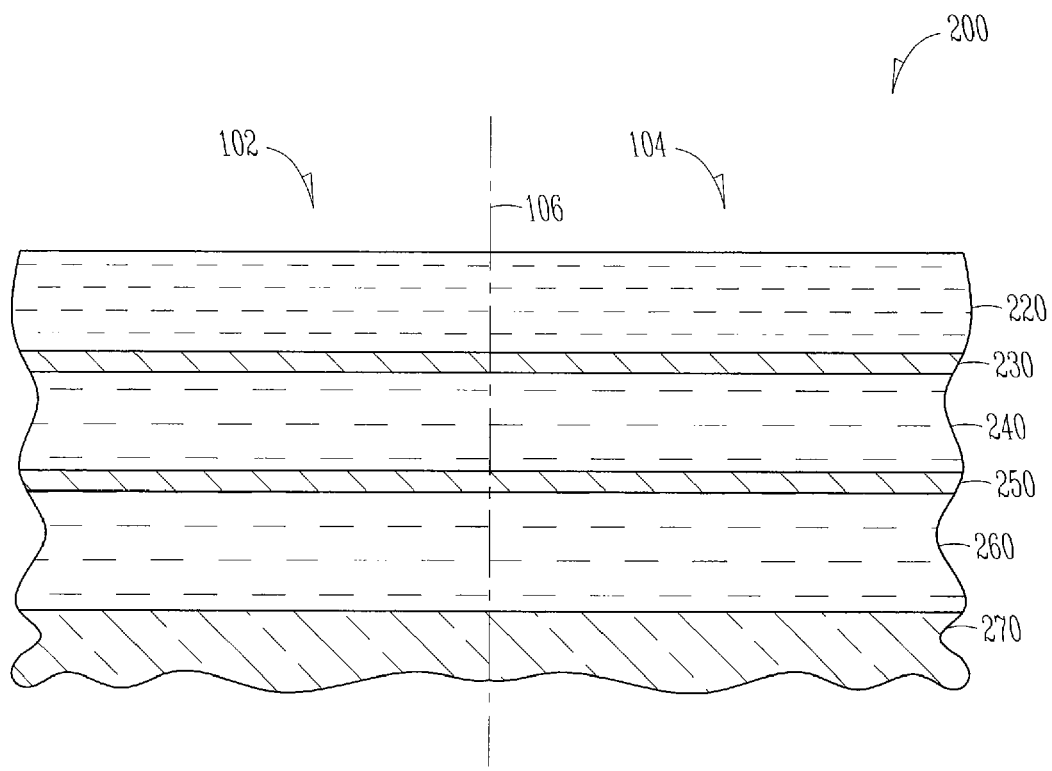
FIG. 2 illustrates a side view of a partially fabricated integrated circuit according to various embodiments, of the invention.

FIG. 2 illustrates a side view of a partially fabricated integrated circuit 100. In various embodiments, partially fabricated integrated circuit may be fabricated to form a memory chip. FIG. 2 is taken along view line 2-2 as shown in FIG. 1. FIG. 2 includes a portion of the central region 102 to the left side of boundary 106, and a portion of the peripheral region 104 to the right side of boundary 106. The portion of integrated circuit 100 as shown in FIG. 2 is not limited to a particular portion of integrated circuit 100 as shown in FIG. 1, and may be any portion of integrated circuit 100 including boundary 106.

Returning to FIG. 2, partially fabricated integrated circuit 100 includes a substrate 270 formed below a plurality of layers 220, 230, 240, 250, and 260. In various embodiments, substrate 270 will be patterned and etched to form a plurality of features, including but not limited to a memory array, and including one or more conductive lines or traces. It would be understood by those of ordinary skill in the art that substrate 270 may comprise any material or materials that are to be processed through the plurality of layers used in the fabrication of the final integrated circuit. Thus, a substrate may include a layer of a single material, a plurality of layers of different materials, a layer or layers having regions of different materials or structures in them, etc. These materials can include semiconductors, insulators, conductors, or combinations thereof. Typically, the substrate comprises structures or layers ultimately forming part of the integrated circuit being fabricated.

The thickness of each of the plurality of layers 220, 230, 240, 250, and 260 is not limited to any particular thickness. The various thicknesses of each of layers 220, 230, 240, 250, and 260 may be determined based on considerations of the chemistry and the process condition requirements to be applied to the plurality of layers 220, 230, 240, 250, and 260 in the fabrication of an integrated circuit.

As shown in FIG. 2, substrate 270 and the plurality of layers 220, 230, 240, 250, and 260 may be divided into a portion in the central region 102, and a portion in the peripheral region 104, by boundary 106. Formation of the plurality of layers 220, 230, 240, 250, and 260 is not limited to any particular method, and may be accomplished by one or more, or a combination of, vapor deposition processes. The materials included in the plurality of layers 220, 230, 240, 250, and 260 is not limited to any particular material. The materials in the plurality of layers 220, 230, 240, 250, and 260 may be selected based on consideration of the chemistry and the process condition requirements for achieving the various pattern transferring steps that may be used in the fabrication of an integrated circuit.

In various embodiments, layer 220 includes a photoresistive layer that can be patterned using a photolithography process. In various embodiments, layer 220 may include argon fluoride (ArF) sensitive photoresist. In various embodiments, layer 220 may include a krypton fluoride sensitive photoresist. Various embodiments, may include the use of 193 nm immersion lithography (193i), which uses a liquid buffer layer (water) to enhance the numerical aperture (NA) beyond 1, typically 1.2-1.35. The technology is capable of defining features below 50 nm, i.e. 45-32 nm range. The optics is still ArF for 193 nm wavelength. Various embodiments may include EUV, or Extreme Ultra Violet, which employs a light source with very narrow wavelength of 13.5 nm, and in principle can define feature sizes less than 30 nm. Optics are all reflective in this technology.

In various embodiments, layer 220 overlays layer 230. Layer 230 may be a hard mask layer. In various embodiments, layer 230 includes silicon dioxide ($SiO_2$), silicon, or a dielectric anti-reflective coating (DARC), such as a silicon-rich silicon oxynitride.

In various embodiments, layer 230 overlays a temporary layer, such as layer 240. Layer 240 may include amorphous carbon, which offers a high etch selectivity relative to the hard mask materials.

In various embodiments, layer 240 overlays layer 250. Layer 250 may be a hard mask layer. In various embodiments, layer 250 includes any of the material or materials described above as included in layer 230. In various embodiments, layer 230 and layer 250 are formed of different materials.

In various embodiments, layer 250 overlays layer 260. Layer 260 may be a mask layer. In various embodiments, layer 260 includes amorphous carbon or transparent amorphous carbon (T-C).

It would be understood that more or fewer layers than shown in FIG. 2 may be used in the embodiments of the present invention. In various embodiments, layers 230 and 240 may be omitted. In various embodiments, layers 250 and 260 may be omitted. The number of layers, the dimensions of these layers, including thickness, and the material forming the layers may be varied in consideration of the chemistry and the processes used in forming the integrated circuits of the various embodiments of the present invention.

In various embodiments, pitch multiplication may be used for extending the capabilities of photolithographic techniques beyond their minimum pitch. In various embodiments, pitch multiplication may be used to produce a partially fabricated integrated circuit, including a plurality of oxide spacer, as further described herein. The oxide spacers may be used as a mask for one or more processes used to form features in a substrate, for example substrate 270, the substrate to be processed into an integrated circuit.

In various embodiments using pitch multiplication, a pattern is formed on a photoresistive layer, such as layer 220. In various embodiments, patterning the photoresistive layer includes exposing the photoresistive layer to radiation through a reticle and then developing the pattern to form spaces in the photoresistive layer. A reticle is the more correct term for a photomask used for the production of integrated circuit devices, the more correct term is usually photoreticle or simply reticle. The spaces formed in the photoresistive layer may be widened by etching, and the spaces in the photoresistive layer may be narrowed by adding addition material and etching the added material to form narrower spaces. In various embodiments, adding additional material includes changing etch chemistry to generate a polymer as the additional material.

In various embodiments, the pattern formed in the photoresistive layer is transferred to a hard mask layer, such as layer 230. The transfer of the pattern to the hard mask layer may be done using an anisotropic etch process. The pattern from the hard mask layer may be transferred to the temporary layer, such as layer 240. Transferring the pattern to layer 240 may include using a $SO_2$-containing plasma.

In various embodiments, a layer of spacer material (not shown) is deposited over the pattern formed in the hard mask layer and the temporary layer, and is deposited so as to be in contact with the second hard mask layer, such as layer 250, in the spaces in the pattern. Spacer material is not limited to any particular type of material, and may include any material used as a mask to transfer a pattern to the underlying mask layer. In various embodiments, the layer of spacer material is processed using an anisotropic etch to remove spacer material from horizontal surfaces of the layer of spacer material. The remaining spacer material forms a plurality of oxide spacers on the surface of the hard mask layer, such as layer 250. The temporary layer, for example layer 240, is then removed, leaving the oxide spacers comprised of the spacer material on the surface of the second hard mask layer.

The oxide spacers may now be used as a mask for further processing of the remaining layers, and for further processing of the substrate. Through the use of pitch multiplication, as described above by way of example and not by way of limitation, smaller dimensions of features, and smaller dimensions between features, may be produced than would be produced by simply using photolithograph. For example, "pitch doubling" may be used as an interval for the pitch multiplication. In pitch doubling, where a given pitch formerly included a pattern defining one feature and one space, the same width may now includes two features and two spaces defined by the oxide spacers. As a result of using pitch multiplication, the smallest feature size possible with a photolithographic technique is effectively decreased.

Figure 3:
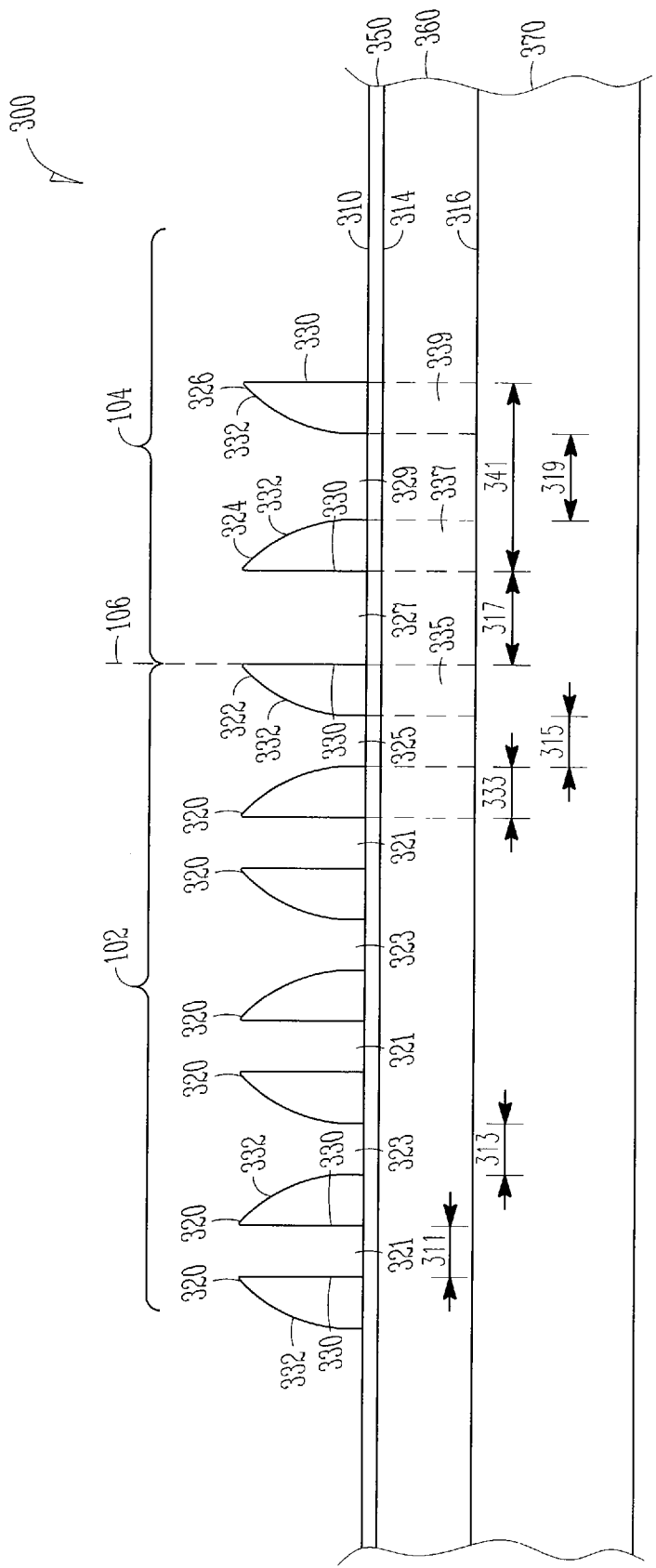
FIG. 3 illustrates an apparatus according to various embodiments of the invention.

FIG. 3 illustrates a partially fabricated integrated circuit 300. In various embodiments, integrated circuit 300 may be fabricated to form a memory chip. In various embodiments, integrated circuit 300 may be fabricated from the plurality of layers illustrated in FIG. 2, wherein layers 350, 360, and substrate 370 in FIG. 3 correspond to layers 250, 260, and substrate 270 of FIG. 2. In various embodiments, the partially fabricated integrated circuit 300 may be fabricated using one or more of the processes described above to form oxide spacers.

Partially fabricated integrated circuit 300 includes boundary 106, central region 102 on the left side of boundary 106, and peripheral region 104 on the right side of boundary 106. In various embodiments, integrated circuit 300 includes a hard mask or etch stop layer 350, which overlays and is in contact with a top surface 314 of a mask layer 360. In various embodiments, the mask layer 360 overlays and is in contact with a top surface 316 of a substrate 370.

In various embodiments, primary hard mask or etch stop layer 350 includes a top surface 310 including a plurality of oxide spacers 320. The plurality of oxide spacers 320 may be formed on the top surface 310 in central region 102. Each of oxide spacers 320 may include inner surface 330 and outer surface 332. Inner surface 330 may be a substantially flat surface and may be substantially perpendicular to top surface 310. Outer surface 332 may be a curved surface extending from top surface 310 up to inner surface 330. The curvature of outer surface 332 provides for a varying width of any oxide spacer including a curved outer surface 332 at different distances above top surface 310. At the point each oxide spacer contacts top surface 310, the oxide spacer includes a bottom width 333.

A plurality of spaces 321 may be included on top surface 310, wherein spaces 321 includes a space along top surface 310 between an inner surface 330 of a first oxide spacer 320 and an inner surface 330 of a second oxide spacer 320. In various embodiments, all of spaces 321 are in central region 102. The width 311 included in spaces 321 is not limited to any particular width. In various embodiments, the width 311 of spaces 321 is a distance less than a size of a feature that could be formed using a photolithographic process that may be used to form one or more features on any other portion of integrated circuit 300. In various embodiments, spaces 321 include one or more different widths.

A plurality of spaces 323 may be included on top surface 310, wherein spaces 323 includes a space along top surface 310 between an outer surface 332 of a first oxide spacer 320 and an outer surface 332 of a second oxide spacer 320. In various embodiments, all of spaces 323 are in central region 102. The width 313 included in spaces 323 is not limited to any particular width. In various embodiments, the width 313 of spaces 323 is the same as the width 311 of spaces 321. In various embodiments, the width 313 of spaces 323 is a distance less than a size of a feature that could be formed using a photolithographic process that may be used to form one or more features on any other portion of integrated circuit 300. In various embodiments, spaces 323 include one or more different widths.

In various embodiments, top surface 310 includes oxide spacer 322. Oxide spacer 322 may include an inner surface 330 and an outer surface 332. Oxide spacer 322 may include a width 335 at top surface 310. In some embodiments, oxide spacer 322 is within central region 102. In some embodiments, inner surface 330 of oxide spacer 322 aligns with boundary 106. In various embodiments, outer surface 332 of oxide spacer 322 forms a space 325 along top surface 310 between the outer surface 332 of oxide spacer 322 and the oxide spacer 320 adjacent and to the left of oxide spacer 322. Space 325 is not limited to any particular width. In various embodiments, the width 315 of space 325 is a distance less than a size of a feature that could be formed using a photolithographic process that may be used to form one or more features on any other portion of integrated circuit 300. In various embodiments, the width 315 of space 325 is the same as the width 313 of one or more of spaces 323.

In various embodiments the inner surfaces 330 and the outer surfaces 332 may have their relative orientations reversed by changing the tone of the reticle. In embodiments providing the reversed orientations, the widths of the oxide spacers and the spaces may be the same as described herein for the non-reversed tone for the reticle.

In various embodiments, top surface 310 includes oxide spacers 324 and 326. Oxide spacers 324 and 326 may each include an inner surface 330 and an outer surface 332. Oxide spacer 324 may include a width 337 at top surface 310, and oxide spacer 326 may include a width 339 at top surface 310. Width 337 and width 339 are not limited to any particular width. In some embodiments, width 337 and width 339 may be the same width. In some embodiments, width 337 and width 339 may be the same width as width 333. In some embodiments, width 337 and 339 may be the same width as width 335.

In various embodiments, the inner surface 330 of oxide spacer 324 forms a space 327 along top surface 310 between the inner surface 330 of oxide spacer 324 and the inner surface 330 of oxide spacer 322. Space 327 is not limited to any particular width. In various embodiments, the width 317 of space 327 is a distance less than a size of a feature that could be formed using a photolithographic process that may be used to form one or more features on any other portion of integrated circuit 300. In various embodiments, the width 317 of space 327 is about the same as the width of space 321.

In various embodiments, oxide spacer 324 and oxide spacer 326 form a space 329 along top surface 310 between the outer surface 332 of oxide spacer 324 and the outer surface 332 of oxide spacer 326. Space 329 is not limited to having any particular width. In various embodiments, the width 319 of space 329 is a distance less than a size of a feature that could be formed using a lithographic process that may be used to form one or more features on any other portion of integrated circuit 300.

In various embodiments, the position of inner surface 330 of oxide spacer 326 along top surface 310 relative to the position of inner surface 330 of oxide spacer 324 is determined to provide a width 341 along top surface 310. Width 341 is not limited to any particular width. In some embodiments, width 341 is substantially the width of an interconnect to be formed in substrate 370 in the area below oxide spacer 324, space 329, and oxide spacer 326, as further described in conjunction with FIG. 4 and FIG. 5.

It would be understood that in various processes used to form the partially fabricated integrated circuit 300, an inverted reticle may be used. An inverted reticle may be likened to a photographic negative, wherein the pattern to be transferred onto the layer of the partially fabricated integrated circuit included in the reticle is inverted with respect to the portions of the reticle that allow transmission of the radiation used to form the pattern and the portions of the reticle that block the transmission of the radiation used to form the pattern. In various embodiments where an inverted reticle may be used, the orientation of the inner surfaces 330 and the outer surfaces 332 may be reversed. However, the use of the inverted reticle may be used to produce the same pattern of oxide spacers with respect to which portions of top surface 310 are covered, and resultant spaces, as shown in FIG. 3.

Figure 4:
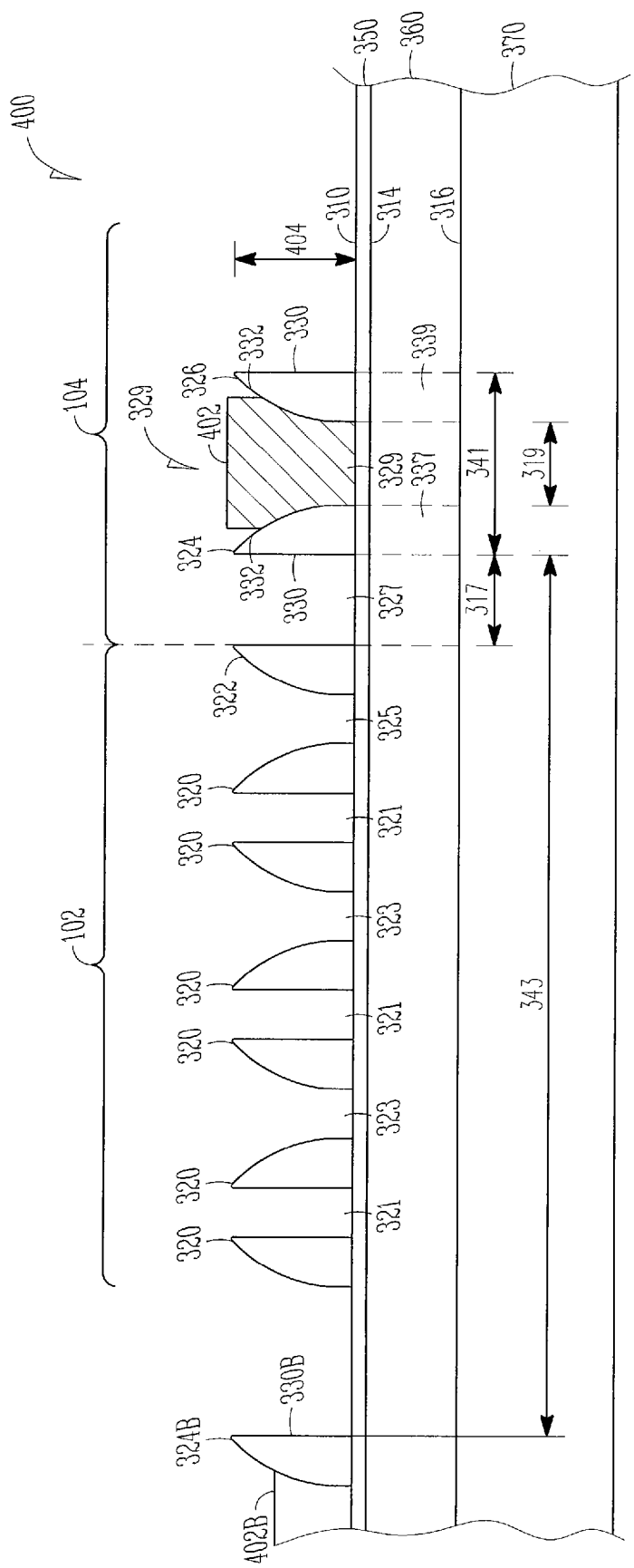
FIG. 4 illustrates an apparatus according to various embodiments of the present invention.

FIG. 4 illustrates a partially fabricated integrated circuit 400. In various embodiments, partially fabricated integrated circuit 400 as illustrated in FIG. 4 includes the partially fabricated integrated circuit 300 of FIG. 3 that has been further processed as described below.

Partially fabricated integrated circuit 400 includes a layer 402 that has been formed in the space 329 between oxide spacer 324 and oxide spacer 326. Layer 402 contacts top surface 310 along space 329, and contacts outer surface 332 of oxide spacer 324 and outer surface 332 of oxide spacer 326. Layer 402 covers the area above space 329 along top surface 310 to a depth 404. Depth 404 is not limited to any particular depth, and may include any depth that is appropriate for any intended further processing that may be performed on partially fabricated integrated circuit 400. Layer 402 is not limited to being formed of any particular material, and may include any material, including but not limited to a photoresistive material. In various embodiments, layer 402 is a material that is readily removable relative to the material used to form any of oxide spacers 320, 322, 324, and 326 in any areas of layer 402 which have not been processed to make these areas intentionally resistive to removal.

Layer 402 is not limited to being formed by any particular process. In various embodiments, layer 402 is formed by depositing a layer of material used to form layer 402 over and covering top surface 310, and over and covering oxide spacers 320, 322, 324, and 326, patterning the covering layer, and etching the covering layer to form layer 402. In various embodiments, patterning the covering layer may be done using a photolithography process that is not capable of providing the tolerance and accuracy with respect to width that may be required for forming width 341.

In various embodiments, where the alignment is not critical, the application of layer 402 may overlap with oxide spacers 324 and 326, and the oxide spacers gain the loading effect of deposition and etching. In various embodiments, only one edge position for layer 402 is critical. For example, if only the edge position formed by the inner surface 330 of oxide spacer 324 is critical, layer 402 may overlap oxide spacer 326, including overlapping the inner surface 330 of oxide spacer 326. In various embodiments, an oxide spacer 324B may be included on an opposite side of central region 102, and may include having a layer 402B formed at the same time and using the same process as was used to form layer 402. In embodiments including oxide spacer 324B and layer 402B, a critical dimension for patterning layers 402 and 402B may be the distance 343 between the inner surface 330 of oxide spacer 324 and an inside surface 330B of oxide spacer 324B. In one or more embodiments including oxide spacers 324 and 324B, the width included in layer 402 and 402B may not be critical, and may overlap one or more oxide spaces on top surface 310 in either direction away from the inner surfaces 330 and 3301B respectively of oxide spacers 324 and 324B and away from central region 102.

By allowing layer 402 to be formed in the space 329 between oxide spacers 324 and 326, the accuracy by which layer 402 needs to be patterned with respect to width is relative to the width 341 which includes width 337, space 329, and width 339. By having the required width 341 along top surface 310 to include width 337 and width 339, the overall accuracy and tolerance for the patterning for layer 402 to produce width 341 may be reduced to a level below the required accuracy and tolerance for forming width 341. Because in various embodiments layer 402 need only be provided with a minimum width to cover width 319 of space 329, and with a maximum width not to exceed width 341, the actual width of layer 402 may vary much more, for example by width 337 or by width 339, and still properly cover the width of space 329. Therefore, a much less precise photolithographic process may be used to form layer 402 and still result in the required accuracy and precision with respect to width 341 that may be required.

In various embodiments, the alignment of the edges of layer 402 within width 341 with respect to the positional accuracy of layer 402 relative to space 329 may be less than instances wherein no oxide spaces are used and wherein the edges of layer 402 are relied on to determine the positions for the edges of width 341 on top surface 310. Because the oxide spacers 324 and 326 provide the edges for the etch mask formed below oxide spacers 324, space 329, and oxide spacer 326, the position of the edges of layer 402 need only be positioned so as to fall along the edges 332 of oxide spacer 324 and 326. Thus, the positional accuracy used to determine the edges of layer 402 may be off by an about up to for example width 337 or 339, and still cover the portion of space 329 included in top surface 310.

By combining the pitch multiplication process used in the central region 102 with processes described herein in the peripheral region 104, the accuracy and tolerances of one or more photolithographic process used to form connective lines and spaces between connective lines in the peripheral region 104 may be reduced (e.g. less precise methods may be used), while still providing a high degree of accuracy and tolerance with respect to the dimensions of features formed in the peripheral region. The use of less precise photolithographic processes results in reduced costs, while still producing the reduced spacing beyond the capabilities of these reduced cost photolithographic techniques.

Figure 5:
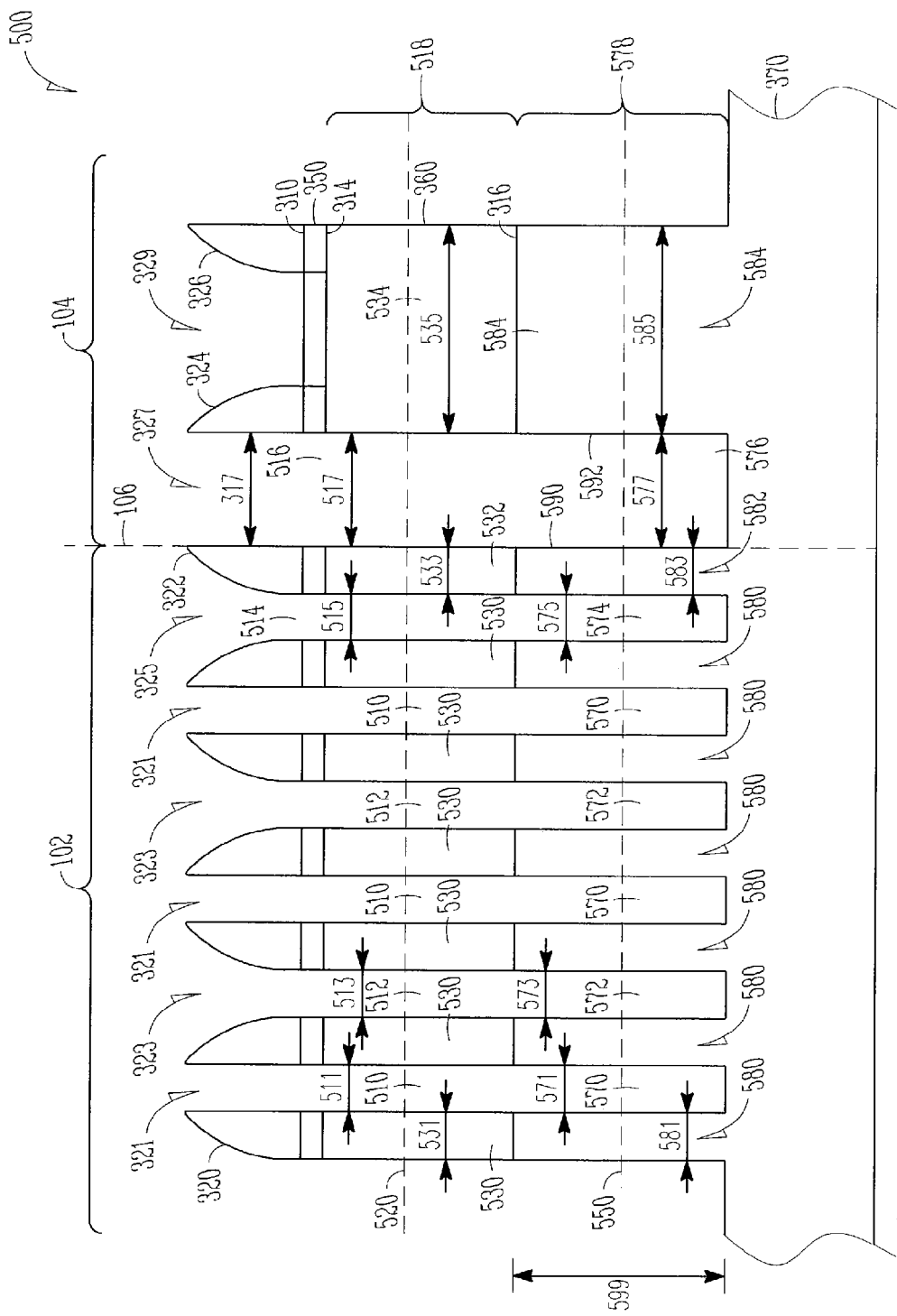
FIG. 5 illustrates an apparatus according to various embodiments of the present invention.

FIG. 5 illustrates various embodiments of the present invention including partially fabricated integrated circuit 500. In various embroilments, partially fabricated integrated circuit 500 as shown in FIG. 5 results from one or more stages of further processing performed on the integrated circuit 400 of FIG. 4.

In various embodiments, partially fabricated integrated circuit 500 includes a plurality of trenches 510 and 512, and one or more each of trench 514, and 516, and area 518. Trenches 510, 512, 514, 516, and area 518 extend from top surface 310 to top surface 316, and so extend through layer 350 and layer 360.

Each one of trenches 510 may be below one of spaces 321 provided in central region 102. Each one of trenches 512 may be below one of spaces 323 provided in central region 102. Trenches 510 and trenches 512 may be bounded on each side of the trench by portions of layer 350 and layer 360 that remain under each of the oxide spacers 320 adjacent to the space above the trench being considered. Each one of trenches 510 may have a width 511, and each one of trenches 512 may have a width 513. Widths 511 and 513 are not limited to any particular widths. In various embodiments, the width 511 for trenches 510 may be the same as the width 513 for trenches 512.

In various embodiments, width 511 may be about the same width as the width of the particular space 321 above the particular trench under consideration. In various embodiments, width 511 may be less than the width of the space 321 above the particular trench being considered. This reduction in width 511 may result from the etch process used in forming trench 510 being terminated just before width 511 reaches a width equal to the width of space 321 above the particular trench being considered.

In various embodiments, width 513 may be about the same width as the width of the particular space 323 above the particular trench under consideration. In various embodiments, width 513 may be less than the width of the space 323 above the particular trench being considered. This reduction in width 513 may result from the etch process used in forming trench 512 being terminated just before width 513 reaches a width equal to the width of space 323 above the particular trench being considered.

In various embodiments, widths 511 and 513 may be determined as the width near the top area of a trench being considered, for example, in a plane coplanar to top surface 310 and extending across the trench, and may be greater than a width 511 or a width 513 determined as the width taken at the bottom of the trench being considered, for example a width taken across the trench being considered in a plane coplanar to top surface 316. In various embodiments, widths 511 and 513 may be a width at a midpoint, for example taken along midline 520, in the trench being considered. In various embodiments, midline 520 is located at distance halfway between the top surface 310 and top surface 316.

In various embodiments, trench 514 may be below space 325 in the central region 102, and adjacent to oxide spacer 322. In various embodiments, trench 514 includes the same characteristics and dimensions as described above with respect to trenches 512. In various embodiments, trench 514 may include a width 515 that is greater than the width 513 used to form trenches 512, although embodiments are not so limited.

In various embodiments, trench 516 may be below space 327 in the peripheral region 104, and adjacent to oxide spacer 324. Trench 516 may be bounded one side by portions of layer 350 and layer 360 that remain under oxide spacer 322, and on the other side by portions of layer 350 and layer 360 that remain under oxide spacer 324. In various embodiments, trench 516 includes a width 517. Width 517 is not limited to any particular width. In various embodiments, the width 517 may be determined at various points along the depth of trench 516, as described above with respect to trenches 510 and 512. In various embodiments, width 517 is determined as the width of trench 516 at midline 520.

In one or more embodiments, a width of at least one of the plurality of trenches 510 and 512 along midline 520 is about 50 nanometers. In one or more embodiments, a width of trench 514 along midline 520 is about 50 nanometers. In various embodiments, a width of trench 516 along midline 520 is about 125 nanometers. In various embodiments, a width of trench 516 along midline 520 is about 70 nanometers. In various embodiments, a width of trench 516 is determined by the electrical requirements for operating an integrated circuit eventually formed from partially fabricated integrated circuit 500.

In various embodiments, area 518 extends from top surface 310 to top surface 316, and is bounded on one side by portions of layers 350 and 360 that remain below oxide spacer 326. In various embodiments, area 518 forms a trench that is bounded on the right side of area 518 by additional portions of layer 350 and 360, or any other material include in partially fabricated integrated circuit 500.

The plurality of trenches 510 and 512, the one or more of trenches 514 and trench 516, and area 518 may be formed by any appropriate etching process or other processes for removing material from an integrated circuit, and is not limited to any particular etching process. In one or more embodiments, one or more of the plurality of trenches 510 and 512, the one or more of trenches 514 and trench 516, and area 518 are formed by an oxide etch.

In forming these trenches, the remaining material of partially fabricated integrated circuit 500 forms a plurality of masks 530, mask 532, and mask 534. The plurality of masks 530, mask 532, and mask 534 extend from top surface 310 to top surface 316, and in various embodiments, include layer 350 and layer 360.

Each of the plurality of masks 530 may be located below one of the oxide spacers 320 in the central region 102. Mask 532 may be located below oxide spacer 322, and may be located in the central region 102 adjacent to boundary 106. Mask 534 may be located in the peripheral region 104, and includes the portion of layer 350 and layer 360 located below oxide spacer 324, space 329, and oxide spacer 326. In forming mask 534, the portions of layer 350 and layer 360 below space 329 were not etched during the process used to form trench 516 and area 518 because these portions of layer 350 and layer 360 were protected during the etch process by a protective layer, for example but not limited to, layer 402 as shown in FIG. 4.

Returning to FIG. 5, the width 531 of any of the plurality of masks 530 is determined by the relative locations of the edges of the trenches on either side of each of the particular mask 530 being considered. The width 531 for any of the plurality of masks 530 may be determined along midline 520, although the embodiments are not so limited. A width 533 of mask 532 may be determined by the relative locations of the edge of trench 514 adjacent to mask 532, and the edge of trench 516 adjacent to mask 532. The width 533 for mask 532 may be determined along midline 520, although the embodiments are not so limited. A width 535 for mask 534 may be determined may be determined by the relative location of the edge of trench 516 adjacent to mask 534, and the edge of area 518 adjacent to mask 534. The width 535 for mask 534 may be determined along midline 520, although the embodiments are not so limited.

In one or more embodiments, a width of at least one of the plurality of masks 530 along midline 520 is about 50 nanometers. In one or more embodiments, a width of mask 532 along midline 520 is about 50 nanometers. In various embodiments, the width of mask 530 and 532 is less than 50 nanometers. In various embodiments, the width of masks 530 and 532 is about 30 nanometers. In one or more embodiments, a width of mask 534 along midline 520 is about 200 nanometers. In various embodiments, the width of mask 534 along midline 520 is about 150 nanometers.

Further processes may be performed on partially fabricated integrated circuit 500 after the formation of the plurality of masks 530, mask 532, and mask 534 to form a plurality of trenches 570 and 572, trench 574, trench 576, and area 578. The plurality of trenches 570, 572, trench 574, trench 576, and area 578 extend from top surface 316 to a depth 599 within substrate 370. Depth 599 is not limited to a particular depth, and may be any depth appropriate for the intended use and fabrication of an integrated circuit. In various embodiments, the depth of each of the plurality of trenches 570 and 572, trench 574, trench 576, and area 578 is the same. In various embodiments, a depth of one or more of the plurality of trenches 570 and 572, trench 574, trench 576, and area 578 is different from a depth of one or more different trenches included in the plurality of trenches 570 and 572, trench 574, trench 576, and area 578.

Forming the plurality of trenches 570 and 572, trench 574, trench 576, and area 578 may be done using any processes appropriate for forming trenches in substrate 370, and may include, but are not limited to, processes used for forming any other portions of partially fabricated integrated circuit 500.

Each one of trenches 570 may be below one of spaces 321 and one of trenches 510 provided in central region 102. Each one of trenches 572 may be below one of spaces 323 and one of trenches 512 provided in central region 102. Trenches 570 and trenches 572 may be bounded on each side of the trench by portions of substrate 370 that remain under each of the oxide spacers 320 adjacent to the space above the trench being considered. Each one of trenches 570 may have a width 571, and each one of trenches 572 may have a width 573. Widths 571 and 573 are not limited to any particular width.

In various embodiments, the width 571 for trenches 570 may be the same as the width 573 for trenches 572. In various embodiments, width 571 may be about the same width as the width of the particular space 321 above the particular trench under consideration. In various embodiments, width 571 may be less than the width of the space 321 above the particular trench being considered. In various embodiments, width 573 may be about the same width as the width of the particular space 323 above the particular trench under consideration. In various embodiments, width 573 may be less than the width of the space 323 above the particular trench being considered.

In various embodiments, width 571 and width 573 may be less than the width of the trench extending through layers 350 and layer 360 above the particular trench being considered. This reduction in widths 571 and 573 may result from the etch process used in forming the trench under consideration. The reduction may result from the etch process being terminated before width 571 or width 573 reaches a width equal to the width of space 321 or space 323 above the particular trench being considered. In various embodiments, widths 571 and 573 includes a width equal to the width of the trench extending through layer 350 and layer 360 above the trench being considered.

In various embodiments, widths 571 and 573 may be determined as the width near the top area of a trench being considered, for example, in a plane coplanar to top surface 316 and extending across the trench, and may be greater than a width 571 and width 573 determined as the width taken at the bottom of trench being considered, for example a width taken across the trench being considered at depth 599. In various embodiments, width 571 and width 573 may be a width at a midpoint, for example taken along midline 550, in the trench being considered. In various embodiments, midline 550 is located at distance halfway between the top surface 316 and the bottom of the trench at depth 599.

In various embodiments, trench 574 may be below space 325 and below trench 514 in the central region 102, and adjacent to oxide spacer 322. In various embodiments, trench 574 includes the same characteristics and dimensions as described above with respect to trenches 572. In various embodiments, trench 574 may include a width 575 that is greater than the width 573 used to form trenches 572, although embodiments are not so limited.

In various embodiments, trench 576 may be below space 327 and below trench 516 in the peripheral region 104, and adjacent to oxide spacer 324. Trench 576 may be bounded one side by portions of substrate 370 that remain under oxide spacer 322, and on the other side by portions of substrate 370 that remain under oxide spacer 324. In various embodiments, trench 576 includes a width 577. Width 577 is not limited to any particular width. In various embodiments, the width 577 of trench 576 is about 125 nanometers. In various embodiments, the width 577 of trench 576 is about 70 nanometers. In various embodiments, width 577 is a width that is less than a size of a feature that could be formed using the photolithographic process that may be used to form one or more features on any other portion of integrated circuit 500 In various embodiments, the width 577 may be determined at various points along the depth of trench 576, as described above with respect to trenches 570 and 572. In various embodiments, width 577 is determined as the width of trench 576 at midline 550.

In various embodiments, the width 577 of trench 576 is about equal to a width 517 of trench 516. In various embodiments, width 577 is about equal to width 317 of space 327. In various embodiments, width 317 of space 327 is a distance less than a size of a feature that could be formed using a photolithographic process that may be used to form one or more features on any other portion of integrated circuit 500. In various embodiments, a positional accuracy associated with the side edges of trench 576 may be determined by the positional accuracy of a first oxide spacer in the peripheral region and a second oxide spacer in the central region along top surface 310. In various embodiments, the first oxide spacer is oxide spacer 324, and the second oxide spacer is oxide spacer 322. In various embodiments, a measurement tolerance for width 577 is determined by the measurement tolerance of width 317.

In various embodiments, area 578 extends from top surface 316 to depth 599, and is bounded on one side by portions of substrate 370 that remain below oxide spacer 326. In various embodiments, area 578 forms a trench that is bounded on the right side of area 578 by additional portions of substrate 370, or any other material include in partially fabricated integrated circuit 500.

The plurality of trenches 570 and 572, trench 574, trench 576, and area 578 may be formed by any appropriate etching process or other processes for removing material from an integrated circuit, and is not limited to any particular etching process. In forming these trenches, the reaming material of partially fabricated integrated circuit 500 forms a plurality of substrate fins 580, substrate fin 582, and substrate fin 584. In various embodiments, the plurality of substrate fins 580, substrate fin 582, and substrate fin 584 extend from top surface 316 to depth 599.

Each of the plurality of substrate fins 580 may be located below one of the oxide spacers 320 in the central region 102. Substrate fin 582 may be located below oxide spacer 322, and may be located in the central region 102 adjacent to boundary 106. Substrate fin 584 may be located in the peripheral region 104, and includes the portion of substrate 370 located below oxide spacer 324, space 329, and oxide spacer 326. In forming the plurality o of substrate fins 580, substrate fin 582, and substrate fin 584, these portions of the substrate were not etched away during the process or processes used to form the plurality of trenches 570 and 572, trench 574, trench 576, and area 578 because these areas of the substrate were protected by the plurality of masks 530, mask 532, and mask 534.

A width 581 of any of the plurality of substrate fins 580 is determined by the relative locations of the edges of the trenches on either side of each of the particular substrate fin being considered. The width 581 for any of the plurality of substrate fins 580 may be determined along midline 550, although the embodiments not so limited. A width 583 of substrate fin 582 may be determined by the relative locations of the edge of trench 574 adjacent to substrate fin 582, and the edge of trench 576 adjacent to substrate fin 582. The width 583 for the substrate fin 582 may be determined along midline 550, although the embodiments are not so limited. A width 585 for the substrate fin 584 may be determined by the relative location of the edge of trench 576 adjacent to substrate fin 584, and the edge of area 578 adjacent to substrate fin 584. The width 585 for substrate fin 584 may be determined along midline 550, although the embodiments are not so limited. In various embodiments, width 581, width 583, and width 585 may be determined alone a line across the substrate fin under consideration in a plane coplanar with top surface 316.

In one or more embodiments, a width of at least one of the plurality of substrate fins 580 along midline 550 is about 50 nanometers. In various embodiments, the width of substrate fins 580 is less than 50 nanometers. In various embodiments the width of substrate fins 580 is about 30 nanometers. In one or more embodiments, a width of substrate fin 582 along midline 550 is about 50 nanometers. In various embodiments, the width of substrate fins 582 is less than 50 nanometers. In various embodiments the width of substrate fins 582 is about 30 nanometers. In one or more embodiments, a width of substrate fin 584 along midline 550 is about 200 nanometers. In various embodiments, a width of substrate fin 584 is less than 200 nanometers. In various embodiments, a width of substrate fin 584 is about 150 nanometers. In various embodiments, a width of substrate fin 584 depends on the requirements for gate length of a select gate being formed from substrate fin 584.

The plurality of substrate fins 580, substrate fin 582, substrate fin 584, and substrate 370 may be further processed to form an integrated circuit, including but not limited to, an integrated circuit including NAND flash memory. In various embodiments, the plurality of substrate fins 580, substrate fin 582, substrate fin 584, and substrate 370 may be processed to form conductive lines coupling one or more devices included in the integrated circuit. In various embodiments, the plurality of substrate fins 580 and substrate fin 582 are each formed to be active interconnect lines within a NAND flash memory array, and substrate fin 584 is formed to be a select gate line of the NAND flash memory. By using one or more of the embodiments described herein, a reduced size NAND flash memory may be provided that maintains the electrical and performance characteristics of larger NAND flash memory devices.

By way example, by using pitch multiplication, the spacing within the memory array (central regions) of a NAND flash memory may be reduced. Further, by carefully controlling the spacing (for example the width of trench 576 in FIG. 5) between the last active interconnect in the memory array and the first active interconnective line in the peripheral region, this spacing may be reduced to a space less than what could have been forming using the photolithography technique use to form one or more other portions of the NAND flash memory, while not having a detrimental effect on the performance characteristic of the device. Still further, many of the widths of the interconnective lines or of the spaces in the memory device are considered to be "critical dimensions" wherein the width of the lines or the spaces affects the performance characterizes of the memory device. By providing the precise spacing and interconnective line widths produced by the various embodiments described herein, a reduced space NAND flash memory device may be provided having the required control over the spacing and interconnective line widths so as to maintain the performance characteristics of the memory device in a reduced space.

In various embodiments, resist can be registration sensitive on one side whereas the other side can over lap and cover the spacers.

Figure 6:
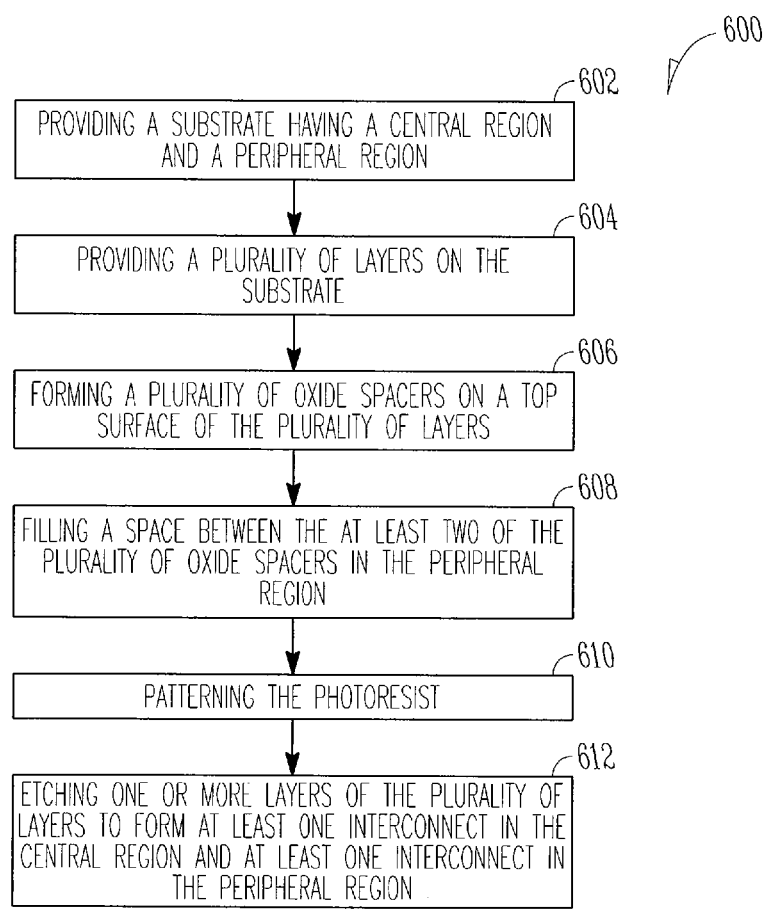
FIG. 6 illustrates a flow diagram according to various embodiments of the present invention.

FIG. 6 is a flow diagram illustrating several methods according to various embodiments of the invention.

Method 600 at block 602 may include providing a substrate having a central region and a peripheral region.

Method 600 at block 604 may include providing a plurality of layers on the substrate, the plurality of layers covering at least a portion of the central region and at least a portion of the peripheral regions adjacent to the portion of the central region covered by the plurality of layers; the plurality of layers including a mask layer overlying the substrate, a first hard mask layer overlying the mask layer, a temporary layer overlying the first hard mask layer, a second hard mask layer overlaying the temporary layer, and a first photoresistive layer overlying the second hard mask layer.

Method 600 at block 606 may include forming a plurality of oxide spacers. In various embodiments, forming a plurality of oxide spacers may include one or more of: forming a first photoresistive pattern in the first photoresistive layer; transferring the first photoresistive pattern to the second hard mask layer and the temporary layer; depositing a layer of spacer material over the pattern formed in the second hard mask layer and the temporary layer; etching the layer of spacer material to remove spacer material from horizontal surfaces of the layer of spacer material to form a plurality of oxide spacers on a surface of the first hard mask layer wherein at least a first and a second oxide spacer are formed over the peripheral region, and at least a third oxide spacer is formed over the central region and having an inner surface at a boundary between the central region and the peripheral region;

Method 600 at block 608 may include filling a space between at least two of the plurality of oxide spacers in the peripheral region. In various embodiments, filling a space between a at least tow of the plurality of oxide spacer in the peripheral region includes on or more of: forming a second photoresistive layer over the plurality of oxide spacers;

Method 600 at block 610 may include patterning the second photoresistive layer using a photolithographic process; forming a mask by etching the patterned second photoresistive layer so that a layer of the photoresistive material fills and remains only in a space between the first and the second oxide spacer.

Method 600 at block 612 may include etching one or more layers of the plurality of layers to form at least one interconnect in the central region and at least one interconnect in the peripheral region separated by a trench. Various embodiments may include one or more of: transferring the pattern formed by the plurality of oxide spacers and the mask into the substrate to form at least one interconnect in the central region and at least one interconnect in the peripheral region separated by a trench in the substrate, the trench having a first side wall below the inner surface of the third oxide spacer and the trench having a second side wall below an inner surface of the first oxide spacer.

Various embodiments may include wherein forming the at least the first and the second oxide spacers over the peripheral region includes each of the first and the second oxide spacers having a width at the surface of the first hard mask layer substantially equal to a width of the third oxide spacer formed over the central region.

Various embodiments may include wherein filling the space between the first and the second oxide spacers with the photoresistive layer includes the space having an alignment margin of one half of a width of the first oxide spacer at the surface of the first hard mask layer.

Various embodiments may include transferring the pattern formed by the plurality of oxide spacers and the mask into the substrate to form at least one interconnect in the central region and at least one interconnect in the peripheral region includes an oxide etch. Various embodiments may include further including processing the central region to include a plurality of memory cells. Various embodiments may include wherein the plurality of memory cells includes NAND flash memory cells.

Various embodiments may include processing the peripheral region to include coupling one or more interconnect lines in the peripheral region to one or more interconnect lines in the central region. Various embodiments may include wherein a width of the at least one interconnect in the peripheral region is about 200 nanometers. Various embodiments may include wherein forming a first pattern in the first photoresistive layer includes patterning the first photoresistive layer using an inverted reticle.

Various embodiments may include wherein depositing a layer of spacer material over the pattern formed in the second hard mask layer and the temporary layer includes forming the layer of spacer material from silicon oxide.

Various embodiments may include wherein transferring the pattern formed by the plurality of oxide spacers and the mask into the substrate to form at least one interconnect in the central region and at least one interconnect in the peripheral region separated by a trench in the substrate includes the trench having a width less than a minimum size feature that may be formed by the photolithographic process.

Figure 7:
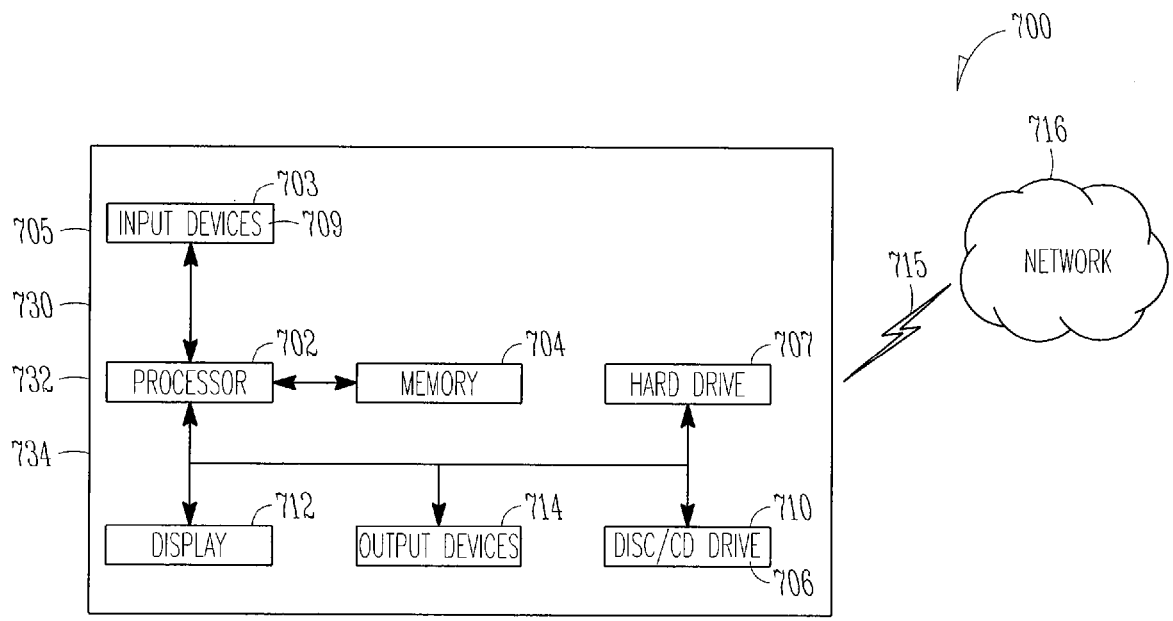
FIG. 7 illustrates a portion of a system according to various embodiments of the invention.

FIG. 7 illustrates a system 700 that includes a processor 702 and a memory device 704. System 700 includes one or more integrated circuits that include one or more embodiments of the present inventive subject matter, or were formed using one or more embodiments of the methods described herein. In various embodiments, memory device 704 includes NAND flash memory, including one or more of the features described herein, or NAND flash memory formed using one or more of the methods described herein, or both.

In various embodiments, system 700 is included in portable memory storage device, such as a memory stick. In various embodiments, system 700 is included in a computer, for example but not limited to, computer 705. In various embodiments, computer 705 is a laptop computer. In various embodiments, computer 705 is a hand held computer. However, the device including system 700 is not limited to a particular device. Other devices including system 700 may include cell phones 730, personal digital assistants (PDA) 732, IP televisions 734, and any other devices that include non-volatile memory.

In various embodiments, computer 705 may include one or more input devices, such as keyboard 703 or a mouse 704, or both. Computer 705 may also include one or more devices for reading inputs from and providing outputs to a magnetic media such as a floppy disk, for example using hard drive 710. Computer 705 may also include one or more devices for inputting and outputting data to a compact disk, for example compact disk drive 706. Computer 705 may include one or more storage devices for storing data, for example but not limited to hard drive unit 707.

Computer 705 may be coupled to one or more output devices 714, for example but not limited to a display 712. Computer 705 may be linked by one or more networks, for example network 716. Network 716 is not limited to any particular type of network, and may include the Internet. Computer 705 may be linked to network 716 one or more types of links, such as but not limited to, wireless link 715.

Although one or more embodiments have been described herein with respect to NAND flash memory and NAND flash memory devices, it should be understood that the embodiments described herein are not limited to NAND flash memory or to NAND flash memory devices, and may be applied to any other type of device formed as an integrated circuit;

Various modifications may be made to the disclosed embodiments without departing from the scope of the invention as claimed below. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

CONCLUSION

Various apparatus, methods, and systems have been described herein, including apparatus, method and system including, but not limited to, NAND flash memory formed as part of an integrated circuit. Embodiments of the invention include pitch doubling used to form oxide spacers in both a central region and in a peripheral region of a partially fabricated integrated circuit. By combining pitch doubling and photolithography techniques, embodiments described herein provide a reduced size device while maintaining the electrical and performance characteristics of the device eventually formed from the partially fabricated integrated circuit.

What is claimed is:

1. An apparatus comprising:
   a substrate including a central region and a peripheral region;
   a plurality of layers above a surface of the substrate, the plurality of layers covering at least a portion of the central region and at least a portion of the peripheral region adjacent to the portion of the central region covered by the plurality of layers, the plurality of layers including a mask layer overlaying the substrate and a hard mask layer overlaying the mask layer, the hard mask layer having a hard mask layer top surface;
   a first plurality of pitch-multiplied oxide spacers on the hard mask layer top surface, the first plurality of pitch-multiplied oxide spacers being above the central region of the substrate and including at least one pitch-multiplied oxide spacer having a substantially flat surface at a boundary between the central region and the peripheral region and a curved surface extending from the hard mask layer top surface up to the substantially flat surface; and
   a second plurality of pitch-multiplied oxide spacers on the hard mask layer top surface, the second plurality of pitch-multiplied oxide spacers above the peripheral region and including at least one pitch-multiplied oxide spacer having a substantially flat surface at a distance from the at least one pitch multiplied oxide spacer having the substantially flat surface at the boundary, the distance no less than a width at the hard mask layer top surface between two of the plurality of pitch-multiplied oxide spacers above the central region, and no more than a width at the hard mask layer top surface of a second mask above an interconnect in the peripheral region and adjacent to the boundary.

2. The apparatus of claim 1, wherein the at least one pitch-multiplied oxide spacer having the substantially flat surface at the boundary between the central region and the peripheral region is above an area of the substrate forming an interconnect in the central region.

3. The apparatus of claim 1, wherein the first plurality of pitch-multiplied oxide spacers and the second plurality of pitch-multiplied oxide spacers include silicon oxide.

4. The apparatus of claim 1, wherein each of the first plurality of pitch-multiplied oxide spacers is above an area of the central region to be used as an interconnect line in an array of memory cells.

5. The apparatus of claim 4, wherein the array of memory cells includes NAND flash memory cells.

6. A system comprising:
   a processor;
   a memory device coupled to the processor, the memory device including a substrate including a central region and a peripheral region and a plurality of layers above a surface of the substrate;
   the plurality of layers above the surface of the substrate covering at least a portion of the central region and at least a portion of the peripheral region adjacent to the portion of the central region covered by the plurality of layers;
   the memory device formed using a first plurality of pitch-multiplied spacers on a top surface of the plurality of layers, the first plurality of pitch-multiplied spacers being above the central region of the substrate and including at least one pitch-multiplied spacer having a first substantially flat surface at a boundary between the central region and the peripheral region and a first curved surface extending from the top surface up to the first substantially flat surface; and
   the memory device further formed using a second plurality of pitch-multiplied spacers on the top surface of the plurality of layers, the second plurality of pitch-multiplied spacers above the peripheral region and including at least one pitch-multiplied spacer having a second substantially flat surface at a distance from the at least one pitch multiplied spacer having the first sustainably flat surface at the boundary and including a second curved surface extending from the top surface up to the second substantially flat surface, the distance no less than a width at the top surface between two of the plurality of pitch-multiplied spacers above the central region, and no more than a width at the top surface of a mask above the top surface and above an interconnect in the peripheral region and adjacent to the boundary.

7. The system of claim 6, wherein the memory device includes NAND flash memory devices.

8. The system of claim 6, wherein the processor is coupled to a network.

9. The system of claim 6, wherein the first plurality of pitch-multiplied spacers and the second plurality of pitch-multiplied spacers include silicon oxide.

10. The system of claim 6, the memory device includes a programmable logic array including a plurality of NOR flash memory cells.

* * * * *